United States Patent
Han (10) Patent No.: US 9,972,404 B2
(45) Date of Patent: May 15, 2018

(54) SEMICONDUCTOR TEST DEVICE AND SEMICONDUCTOR TEST METHOD

(71) Applicant: SK hynix Inc., Icheon-si, Gyeonggi-do (KR)

(72) Inventor: Min Sik Han, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/436,278

(22) Filed: Feb. 17, 2017

(65) Prior Publication Data

US 2018/0019023 A1 Jan. 18, 2018

(30) Foreign Application Priority Data

Jul. 15, 2016 (KR) ........................ 10 2016 0089956

(51) Int. Cl.
*G11C 29/00* (2006.01)
*G11C 29/50* (2006.01)
*G11C 11/4076* (2006.01)

(52) U.S. Cl.
CPC .... *G11C 29/50004* (2013.01); *G11C 11/4076* (2013.01)

(58) Field of Classification Search
CPC ....................... G11C 29/50004; G11C 11/4076
USPC .......................................................... 365/201
See application file for complete search history.

(56) References Cited

U.S. PATENT DOCUMENTS

2008/0178054 A1* 7/2008 Lee .................. G11C 29/40
714/719
2011/0275170 A1 11/2011 Wagenen et al.

* cited by examiner

*Primary Examiner* — Huan Hoang
(74) *Attorney, Agent, or Firm* — William Park & Associates Ltd.

(57) ABSTRACT

A semiconductor test device and a semiconductor test method are disclosed. A semiconductor test device may include a DQ signal receiver, a test mode register set signal processor, and a test mode command generator. The DQ signal receiver may receive a first DQ signal through a first DQ pin. The test mode register set signal processor may receive a test mode register set signal in response to the first DQ signal, and may output a test mode register set pulse signal. The test mode command generator may generate a test mode command corresponding to an input address in response to the test mode register set pulse signal.

9 Claims, 7 Drawing Sheets

SEMICONDUCTOR TEST DEVICE AND SEMICONDUCTOR TEST METHOD

CROSS-REFERENCE TO RELATED APPLICATION

This application claims priority under 35 U.S.C 119(a) to Korean patent application number 10-2016-0089956, filed on Jul. 15, 2016, the disclosure of which is incorporated herein by reference in its entirety.

BACKGROUND

Embodiments of the present disclosure generally relate to a semiconductor test device and a semiconductor test method, and more particularly to a semiconductor test device and a semiconductor test method applying different test commands to a plurality of semiconductor chips contained in a wafer when testing the wafer.

Semiconductor device testing is a process to make sure whether a semiconductor device (e.g., DRAM and flash memory) functions as intended. Wafer testing is a process performed during semiconductor device fabrication, and, during the wafer testing process, the semiconductor devices in a wafer may be tested by a semiconductor test device.

Since the semiconductor test device is generally very expensive, the wafer testing is performed by using a limited number of semiconductor test devices. Higher levels of integration on a semiconductor device lead to significant increase in test time. As the test time is increased, the entire manufacturing process, from a wafer to packaged semiconductor chips, takes more time than before. Therefore, there is a need to test as many semiconductor chips as possible at the same time by using a single semiconductor test device.

During the wafer testing, the semiconductor test device is connected to a limited number of pins of each semiconductor chip, and the semiconductor test device usually applies the same signal to all the semiconductor chips of the wafer to reduce the number of pins needed for the wafer testing. Accordingly, address pins of respective semiconductor chips may receive the same signal from the semiconductor test device.

Under this testing environment, even in a situation where different test commands need to be applied to respective semiconductor chips, if a test command is applied to the semiconductor chips through the address pins, the same test command is applied to all the semiconductor chips. In addition, under this testing environment, if the respective semiconductor chips use different pins in receiving the test command, the semiconductor test device will need to have as many terminals as possible, and it will be difficult to apply different test signals to the respective semiconductor chips.

SUMMARY

In an embodiment of the present disclosure, a semiconductor test device may include a DQ signal receiver, a test mode register set signal processor, and a test mode command generator. The DQ signal receiver may receive a first DQ signal through a first DQ pin. The test mode register set signal processor may receive a test mode register set signal in response to the first DQ signal, and may output a test mode register set pulse signal. The test mode command generator may generate a test mode command corresponding to an input address in response to the test mode register set pulse signal.

In an embodiment of the present disclosure, a semiconductor test device may include a DQ signal application circuit, an address application circuit, and a test result input circuit. The DQ signal application circuit may apply a first DQ signal through a first DQ pin of a first semiconductor chip. The address application circuit may apply a first address corresponding to a first test command through an address pin coupled in common to the first semiconductor chip and a second semiconductor chip different from the first semiconductor chip. The test result input circuit may receive a test result obtained as a result of executing the first test command in the first semiconductor chip.

In an embodiment of the present disclosure, a semiconductor test method for testing a plurality of semiconductor chips including a first semiconductor chip and a second semiconductor chip may include applying a first DQ signal through a first DQ pin of the first semiconductor chip, applying a first address corresponding to a first test command through an address pin coupled in common to the first semiconductor chip and the second semiconductor chip, and receiving a test result obtained as a result of executing the first test command in the first semiconductor chip.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts.

Figure 1:
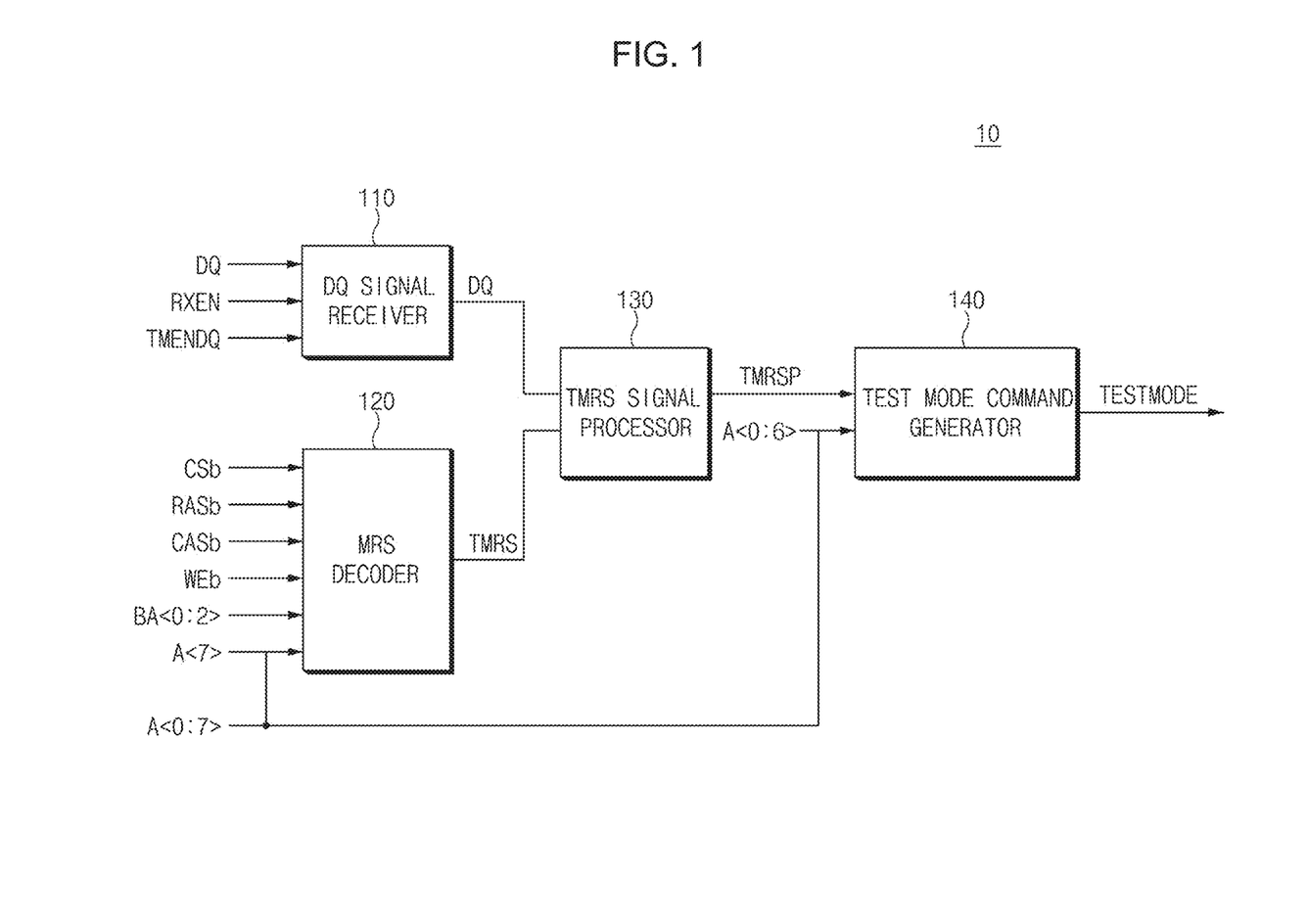
FIG. 1 is a diagram illustrating an example of a semiconductor test device for a receiver according to an embodiment of the present disclosure.

FIG. 1 is a diagram illustrating an example of a semiconductor test device 10 for a receiver according to an embodiment of the present disclosure. Referring to FIG. 1, the semiconductor test device 10 for the receiver may include a DQ signal receiver 110, a mode register set (MRS) decoder 120, a test mode register set (TMRS) signal processor 130, and a test mode command generator 140.

If a reception enable signal RXEN or a DQ test mode enable signal TMENDQ is activated or enabled, the DQ signal receiver 110 may receive a DQ signal received through a DQ pin of each semiconductor chip, and may output the received DQ signal.

In more detail, the reception enable signal RXEN may be used to determine whether the input of the DQ signal received through the DQ pin will be allowed. That is, the reception enable signal RXEN may activate or enable the DQ pin of the semiconductor chip so that the DQ signal is provided to the test mode register set signal processor 130. Here, the reception enable signal RXEN may be activated or enabled not only when a test mode command TESTMODE is to be generated, but also when the DQ signal for a normal operation such as a write operation is received.

The DQ test mode enable signal TMENDQ is a signal that is usable to determine whether a test mode is set, using the DQ signal received through the DQ pin. That is, the DQ test mode enable signal TMENDQ is a signal that is usable to determine whether the test mode command will be generated. That is, if the DQ test mode enable signal TMENDQ is activated, and the DQ signal received through the DQ pin is at a high level, the DQ signal receiver 110 may output the input DQ signal. By means of the DQ signal, the semiconductor test device 10 for the receiver may output the test mode command TESTMODE to the semiconductor chip having received the DQ signal as described later.

If the reception enable signal RXEN or the DQ test mode enable signal TMENDQ is activated, the DQ signal receiver 110 may output the input DQ signal. However, the scope of the present disclosure is not limited thereto, and the DQ signal may be output only when the DQ test mode enable signal TMENDQ is activated.

The mode register set decoder 120 may receive a chip select bar signal CSb, a low address strobe bar signal RASb, a column address strobe bar signal CASb, a write enable signal WEb, and addresses A<7> and BA<0:2>, and may output a test mode register set signal TMRS.

Generally, a mode register set may store information that is used to put a synchronous DRAM into various modes. A Column Address Strobe (CAS) Latency (CAS latency or CL), a burst type, and a burst length (BL) may be selected according to the mode register set programmed by the user.

A central processing unit (CPU) may store the CAS Latency, the burst type, and the burst length of the semiconductor chip in the mode register before accessing the semiconductor chip.

The mode register set may be set based on a mode register set command and the address A<0:7> provided by a state machine, which decodes control signals (e.g., RASb, CASb, and WEb). For example, according to the specification of Double Data Rate (DDR) SDRAM provided by Joint Electron Device Engineering Council (JEDEC), the address A<0:2> may determine a burst length, the address A3 may determine a burst type (e.g., sequential, interleave, etc.), the address A<4:6> may determine the CAS latency (CL), and the address A<7> may determine whether a current mode is a test mode or a normal mode.

If an address signal A<7> at a high level is input to the MRS decoder 120, the MRS decoder 10 may output the test mode register set signal TMRS so that the semiconductor chip can enter the test mode. In an embodiment, the test mode command TESTMODE corresponding to the address A<0:6> may be output through the TMRS signal processor 130.

The TMRS signal processor 130 may receive the DQ signal generated by the DQ signal receiver 110 and the test mode register set signal TMRS generated by the MRS decoder 120, and may output a test mode register set pulse signal TMRSP generated based on the received the DQ signal and the test mode register set signal TMRS.

In more detail, if the DQ test mode enable signal TMENDQ is activated, and if the DQ signal generated by the DQ signal receiver 110 is at a high level, the TMRS signal processor 130 may receive the test mode register set signal TMRS from the MRS decoder 120, and may thus output the test mode register set pulse signal TMRSP.

In other words, the TMRS signal processor 130 may output the test mode register set signal TMRS only when the DQ signal received through the DQ pin of the semiconductor chip to be tested is at a high level.

Since the DQ pin is a terminal that outputs the test result of the semiconductor chip, the DQ pins of the respective semiconductor chips may be connected to different terminals of the semiconductor test device when two or more semiconductor chips are simultaneously tested. Therefore, unlike the address pins, the semiconductor test device may apply different DQ signals to the respective semiconductor chips.

In an embodiment, the TMRS signal processor 130 may output the test mode register set signal TMRS as the test mode register set pulse signal TMPSP only when the DQ signal is at a high level. Therefore, by setting different DQ signals for different semiconductor chips, it is possible to apply the test mode register set signal TMRS to only some of the semiconductor chips, not to all of the semiconductor chips.

For example, a high-level signal may be input as the DQ signal to the semiconductor chip A, and a low-level signal may be input as the DQ signal to the semiconductor chip B. In this case, if a high-level signal is input as the address A<7>, since the address pin is connected in common to the semiconductor chip A and the semiconductor chip B, each of the mode register set decoder 120 of the receiver-side semiconductor test device contained in the semiconductor chip A and the mode register set decoder 120 of the receiver-side semiconductor test device contained in the semiconductor chip B may generate the test mode register set signal TMRS. However, since a high-level DQ signal is input only to the semiconductor chip A, the test mode register set pulse signal TMRSP is generated only in the semiconductor chip A, and the test mode register set pulse signal TMRSP is not generated in the semiconductor chip B. Therefore, when the semiconductor chip A and the semiconductor chip B are simultaneously tested, the test mode command may be selectively generated only in the semiconductor chip A.

The test mode command generator 140 may output the test mode command TESTMODE according to the address <0:6>. For example, by setting specific values as address signals <0:6>, an internal voltage VCORE of the semiconductor chip may be set accordingly. For example, if the address signals <0:6> are "000111," the internal voltage VCORE may be set to 1.05V. If the address signals <0:6> are "000110," the internal voltage VCORE may be set to 1.15V.

Figure 2:
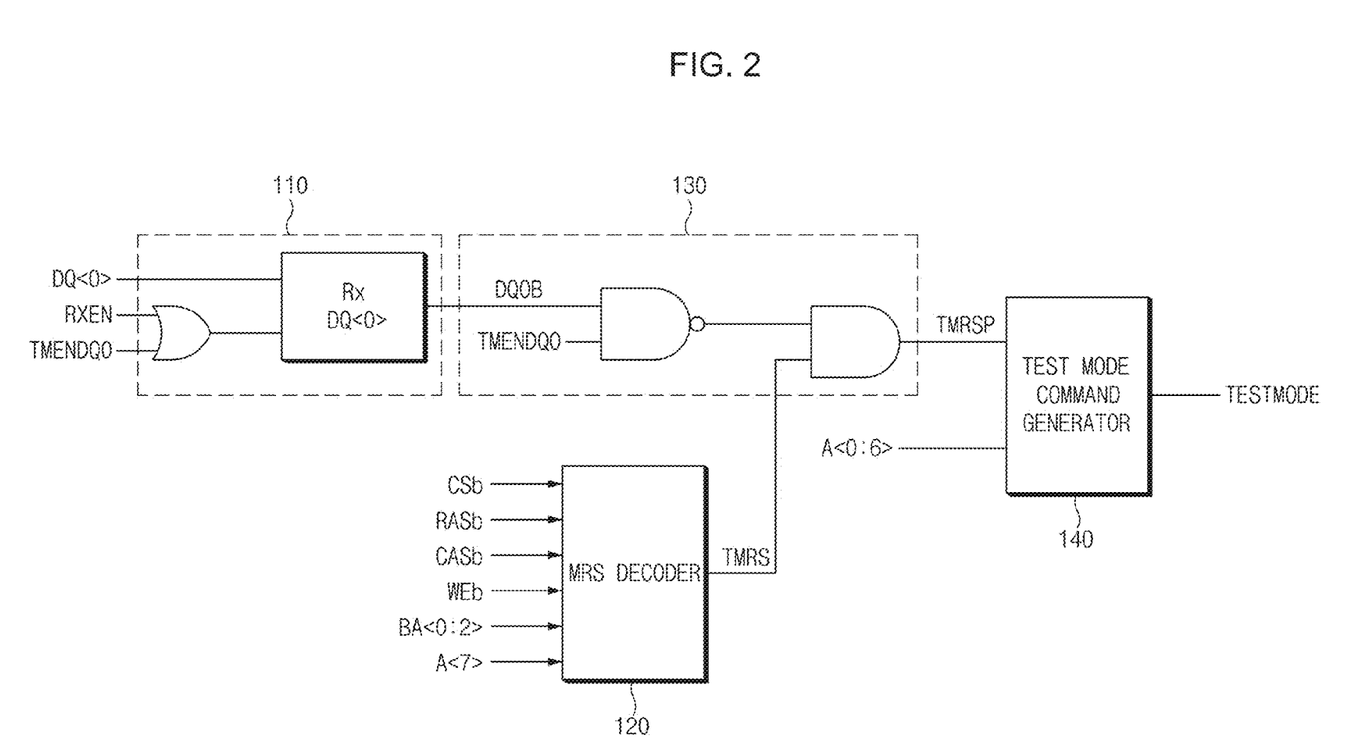
FIG. 2 is a detailed circuit diagram illustrating an example of the semiconductor test device shown in FIG. 1.

FIG. 2 is a detailed circuit diagram illustrating an example of the semiconductor test device 10 for the receiver shown in FIG. 1.

The MRS decoder 120 shown in FIG. 2 may be identical to the MRS decoder 120 shown in FIG. 1. The test mode command generator 140 shown in FIG. 2 may be identical to the test mode signal generator 140 shown in FIG. 1. Thus, a detailed description thereof will be omitted for convenience of description.

The DQ signal receiver 110 may include a flip-flop RX DQ<0>. In this case, the flip-flop RX DQ<0> may receive the DQ signal through the DQ< >0> pin, and may be activated in response to a reception enable signal RXEN or a DQ0 test mode enable signal TMENDQ0. Although the flip-flop RX DQ<0> according to an embodiment is illustrated as receiving the DQ signal through the DQ<0> pin, it should be noted that another DQ pin instead of the DQ<0> pin may also be used as necessary.

The TMRS signal processor 130 may include a logic gate performing a NAND operation on an inversion signal DQ0B of the DQ signal generated by the flip-flop RX DQ<0> and the DQ0 test mode enable signal TMENDQ0, and a logic gate performing an AND operation on an output signal of the NAND gate and an output signal TMRS of the MRS decoder.

Accordingly, after the DQ0 test mode enable signal TMENDQ0 is activated, the DQ signal is sent to an output terminal of the NAND gate. In this case, if the DQ signal is at a high level, the TMRS signal may be output as the TMRSP signal through an output terminal of the AND gate.

Figure 3:
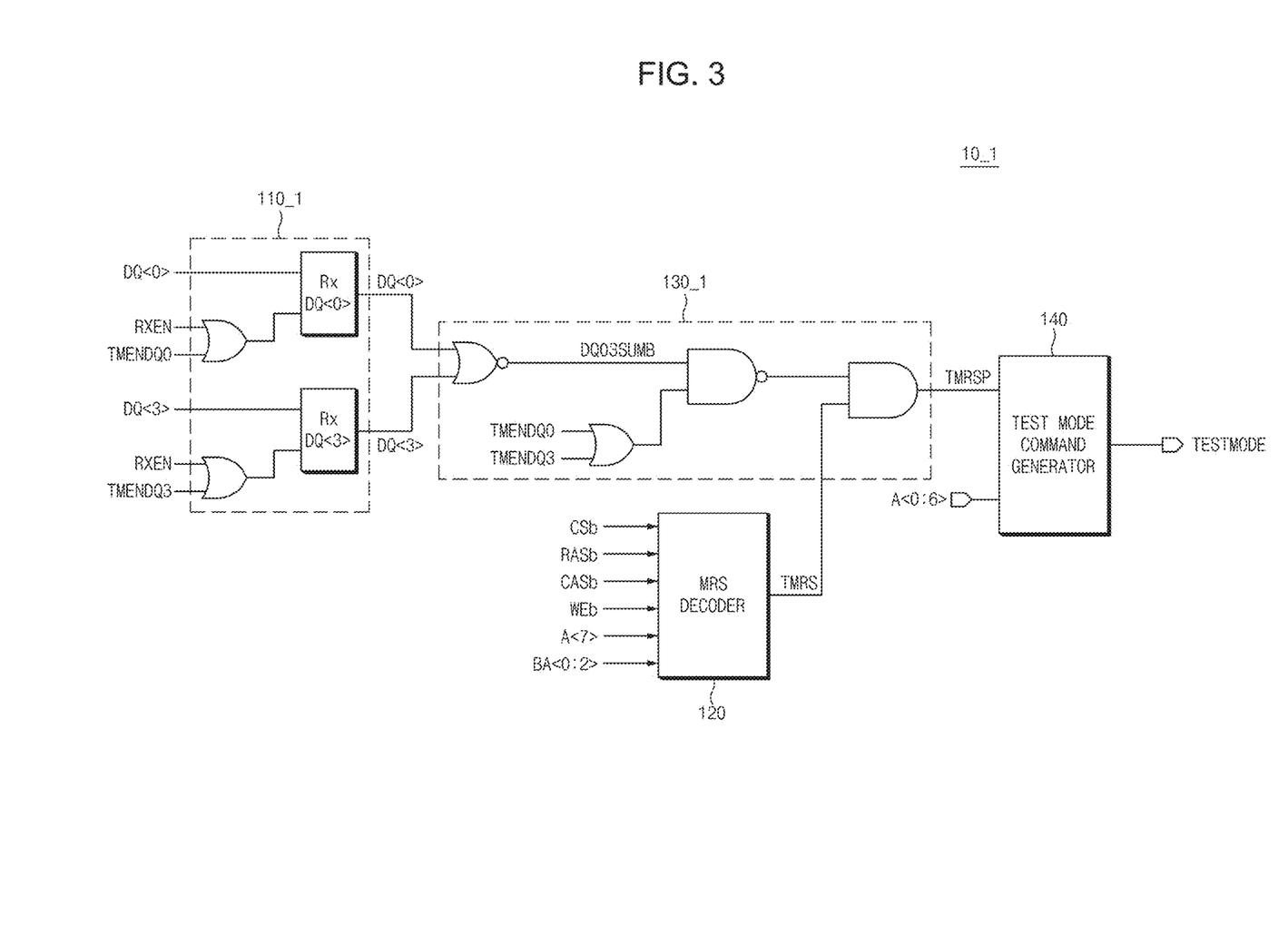
FIG. 3 is a diagram illustrating an example of a semiconductor test device for a receiver according to an embodiment of the present disclosure.

FIG. 3 is a diagram illustrating an example of a semiconductor test device for a receiver according to an embodiment of the present disclosure.

Referring to FIG. 3, the semiconductor test device 10_1 may include a DQ signal receiver 110_1, a mode register set (MRS) decoder 120, a test mode register set (TMRS) signal processor 130_1, and a test mode command generator 140.

The MRS decoder 120 and the test mode command generator 140 illustrated in FIG. 3 are identical to the MRS decoder 120 and the test mode command generator 140 illustrated in FIG. 2, and thus a detailed description thereof will be omitted for convenience of description.

The DQ signal receiver 110_1 may include first and second flip-flops RX DQ<0> and RX DQ<3>. The first flip-flop RX DQ<0> may receive a first DQ signal through the DQ<0> pin in the same manner as the flip-flop RX DQ<0> of FIG. 2. In this case, when at least one of the reception enable signal RXEN and the DQ0 test mode enable signal TMENDQ0 is activated, the DQ signal receiver 110_1 may receive the DQ signal.

The second flip-flop RX DQ<3> may receive the DQ signal through the DQ<3> pin. In this case, when at least one of the reception enable signal RXEN and the DQ3 test mode enable signal TMENDQ3 is activated, the second flip-flop RX DQ<3> may receive the DQ signal.

When at least one of the DQ0 test mode enable signal TMENDQ0 and the DQ3 test mode enable signal TMENDQ3 is activated, and when at least one of the DQ signal DQ0 generated by the first flip-flop RX DQ<0> and the DQ signal DQ3 generated by the second flip-flop RX DQ<3> is at a high level, the test mode register set signal processor 130_1 may output the test mode register set signal TMRS, which is the output signal of the mode register set decoder 120, as the test mode register set pulse signal TMRSP.

In more detail, the test mode register set signal processor 130_1 may include a NOR gate, an OR gate, a NAND gate, and an AND gate. The NOR gate may perform a NOR operation on the DQ signal DQ<0> generated by the first flip-flop RX DQ<0> and the DQ signal DQ<3 generated by the second flip-flop RX DQ<3>. The OR gate may perform an OR operation on the DQ0 test mode enable signal TMENDQ0 and the DQ3 test mode enable signal TMENDQ3. The NAND gate may perform a NAND operation on an output signal DQ03SUMB of the NOR gate and an output signal of the OR gate. The AND gate may perform an AND operation on an output signal of the NAND gate and the output signal TMRS of the MRS decoder 120, and may output the test mode register set pulse signal TMRSP.

The semiconductor test device 10_1 according to an embodiment may receive the DQ signals DQ<0> and DQ<3> using two DQ pins. If any one of the DQ signals DQ<0> and DQ<3> is at a high level, the test mode register set pulse signal TMRSP is generated. The semiconductor test device 10_1 may receive and decode the address <0:6> every time the test mode register set pulse signal TMRSP is received, and the test mode command is generated to test the semiconductor chips.

Since the semiconductor test device illustrated in FIG. 3 has two DQ pins for DQ signal reception, the semiconductor test device may use other DQ pins even when a specific DQ pin is unavailable.

Nevertheless, the scope of the present disclosure is not limited thereto, and the DQ signal may be received through three or more DQ pins as necessary.

Figure 4:
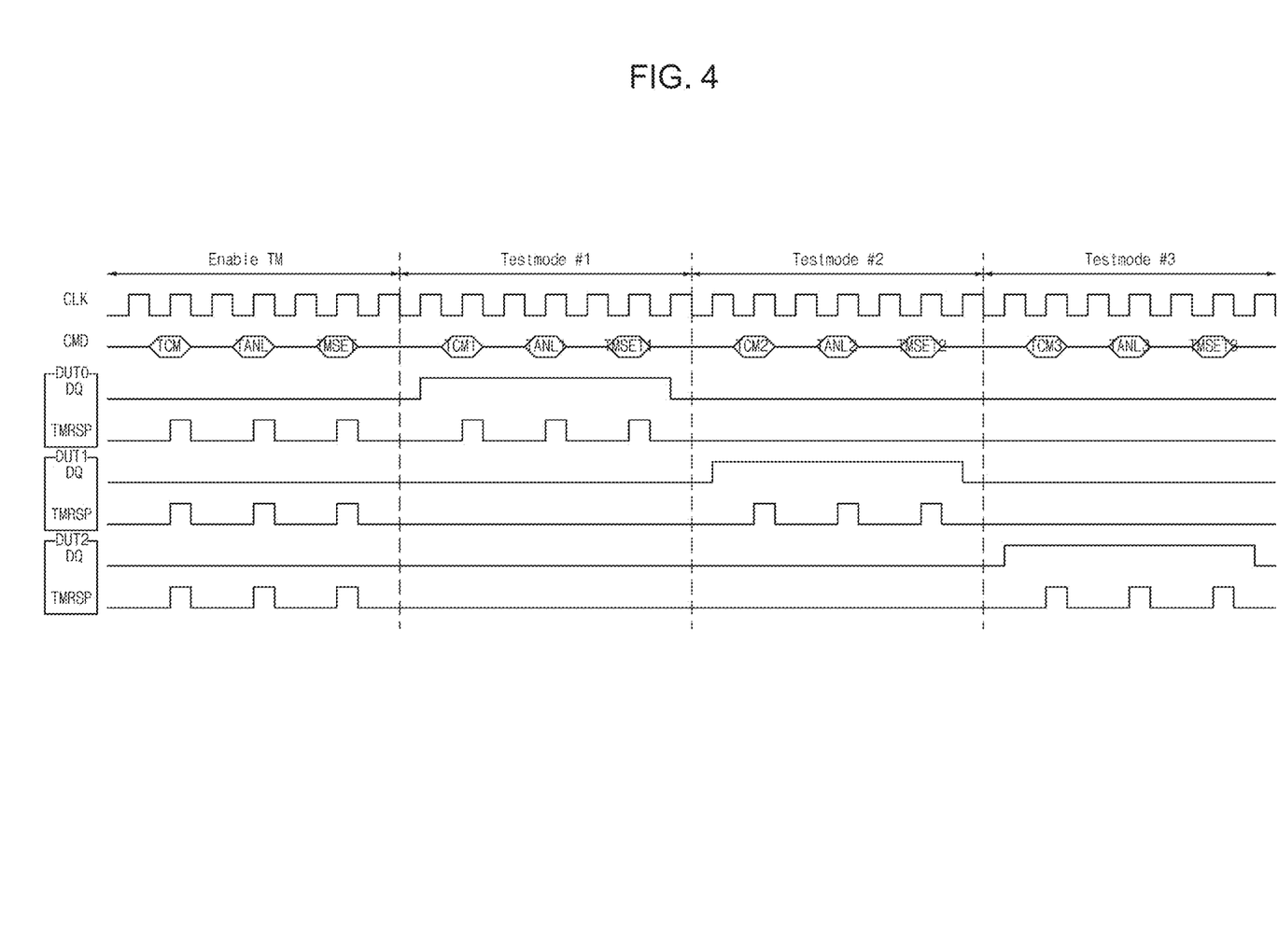
FIG. 4 is a timing diagram illustrating DQ signals and Test Mode Register Set (TMRS) signals for each Device Under Test (DUT) according to an embodiment of the present disclosure.

FIG. 4 is a timing diagram illustrating DQ signals and Test Mode Register Set (TMRS) signals for each Device Under Test (DUT) according to an embodiment of the present disclosure.

Referring to FIG. 4, test mode commands (e.g., TCM, TANL, and TMSET) are generated by decoding the address A<0:6> of FIG. 1, and a specific test mode is entered by the above-mentioned test mode commands (i.e., TCM, TANL, TMSET).

In a first test mode period Testmode #1, a high-level DQ signal may be applied only to a first semiconductor chip DUT0, and a low-level DQ signal may be applied to a second semiconductor chip DUT1 and a third semiconductor chip DUT2.

Accordingly, the test mode register set pulse signal TMRSP may be applied only to the first semiconductor chip DUT0, and the test mode command signals (e.g., TCM, TANL, and TMSET) may be applied only to the first semiconductor chip DUT0. In an example, the internal voltage VCORE may be set to 1.05V. Accordingly, the internal voltage VCORE may be set to 1.05V, and the first semiconductor chip DUT0 may be tested accordingly.

In a second test mode period Testmode #2, a high-level DQ signal may be applied only to the second semiconductor chip DUT1, and a low-level DQ signal may be applied to the first semiconductor chip DUT0 and the third semiconductor chip DUT2.

Therefore, the test mode register set pulse signal TMRSP is applied only to the second semiconductor chip DUT1, and the test mode command signals (e.g., TCM, TANL, and TMSET) are applied only to the second semiconductor chip DUT1. In an example, the internal voltage VCORE may be set to 1.15V. Accordingly, the internal voltage VCORE may be set to 1.15V, such that the second semiconductor chip DUT1 may be tested.

In a third test mode period Testmode #3, a high-level DQ signal may be applied only to the third semiconductor chip DUT2, and a low-level DQ signal may be applied to the first semiconductor chip DUT0 and the second semiconductor chip DUT1.

Therefore, the test mode register set pulse signal TMRSP is applied only to the third semiconductor chip DUT2, and the test mode command signals (e.g., TCM, TANL, and TMSET) are applied only to the third semiconductor chip DUT2. In an example, the internal voltage VCORE may be set to 1.25V. Accordingly, the internal voltage VCORE may be set to 1.25V, and the third semiconductor chip DUT2 may be tested.

In an embodiment, when the plurality of semiconductor chips is simultaneously tested, a high-level DQ signal may be applied only to a target semiconductor chip scheduled to receive a specific test mode command. The test mode command may be applied only to the semiconductor chip having received the high-level DQ signal. Therefore, the semiconductor test device according to an embodiment can simultaneously input, using a common address pin, the test mode command to the plurality of semiconductor chips instead of inputting the test mode command to the plurality of semiconductor chips through separate terminals of the semiconductor test device. The semiconductor test device can input the test mode command, among the plurality of semiconductor chips, only to the semiconductor chip having a high-level DQ signal.

Figure 5:
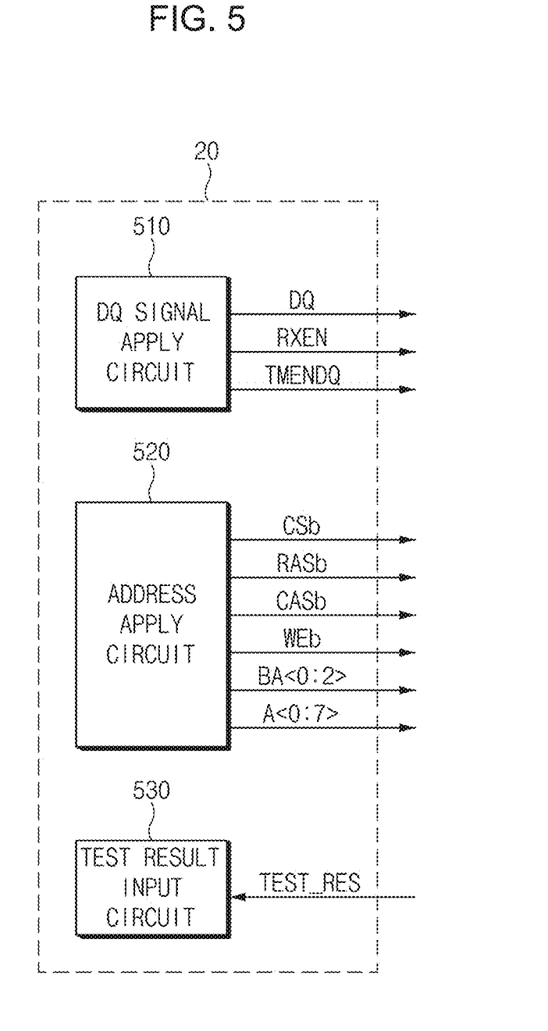
FIG. 5 is a diagram illustrating an example of a semiconductor test device for a transmitter according to an embodiment of the present disclosure.

FIG. 5 is a diagram illustrating an example of a semiconductor test device 20 for a transmitter according to an embodiment of the present disclosure.

Referring to FIG. 5, the semiconductor test device 20 for the transmitter may generate various signals to be applied to the receiver's semiconductor test device 10, and may input the generated signals to the receiver's semiconductor test device 10.

The semiconductor test device 20 may include a DQ signal application circuit 510, an address application circuit 520, and a test result input circuit 530.

The DQ signal application circuit 510 may generate the DQ signal for the receiver-side semiconductor test device 10, and may apply the generated DQ signal. In this case, the reception enable signal RXEN and the DQ test mode enable signal TMENDQ may be generated and applied to the receiver-side semiconductor test device 10.

The application of the DQ signal generated by the DQ signal application circuit 510 for the receiver-side semiconductor test device 10 connected to the respective semiconductor chips may vary. For example, when the DQ signal is applied to some of the semiconductor chips, the other semiconductor chips do not receive the DQ signal.

The address application circuit 520 may generate signals (e.g., CSb, RASb, CASb, WEb, BA<0:2>, and A<0:7>) to be applied to the MRS decoder 120 and the test mode command generator 140 shown in FIG. 1. In an embodiment, by setting the address A<7> to a logic high level, the test mode may be entered. The specific value may be set to the address A<0:6> to allocate a specific value to the internal voltage VCORE.

The address application circuit 520 may apply the address A<0:7> in common to the receiver-side semiconductor test device 10 connected to the respective semiconductor chips. Here, since different DQ signals are applied to the respective semiconductor test devices 10 of the receiver, different test mode commands may be generated in the respective semiconductor chips even if the address A<0:7> is applied to all the semiconductor chips.

The test result input circuit 530 may receive a test result signal TEST_RES obtained as a result of executing the test mode command with respect to the semiconductor chip connected to the semiconductor test device 10 of the receiver. Therefore, the semiconductor test device for the transmitter may determine whether or not the semiconductor chip is defective by analyzing the test result signal TEST_RES.

Figure 6:
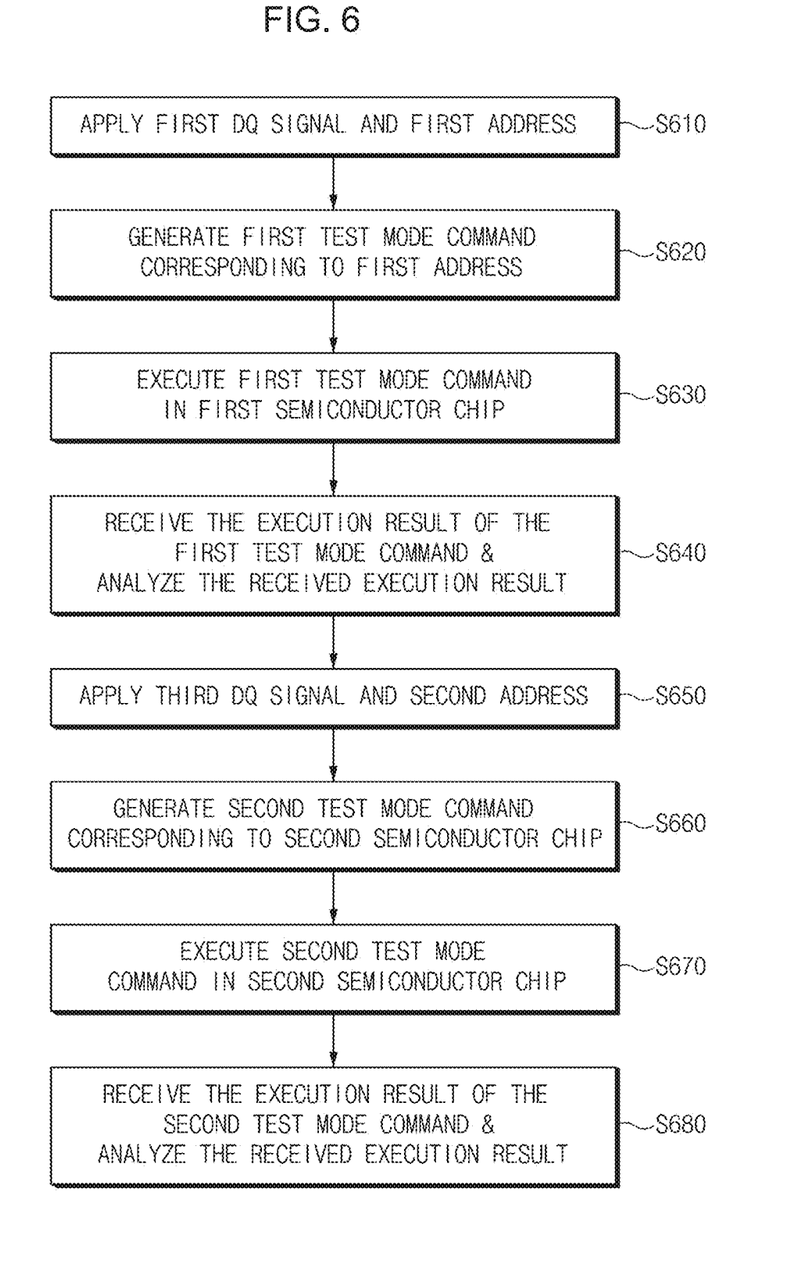
FIG. 6 is a flowchart illustrating an example of a semiconductor test method according to an embodiment of the present disclosure.

FIG. 6 is a flowchart illustrating an example of a semiconductor test method according to an embodiment of the present disclosure.

In FIG. 6, it is assumed that a transmitter-side semiconductor test device 20 may test a first semiconductor chip and a second semiconductor chip, and a receiver-side semiconductor test device 10 is connected to each of the first semiconductor chip and the second semiconductor chip. The testing may include a plurality of steps S610 to S680.

When testing the first semiconductor chip, the semiconductor test device 20 may apply a first DQ signal to a first DQ pin of the first semiconductor chip, and may apply a first address to the first semiconductor chip through the address pin in the step S610. Here, the first address is applied to both the first and second semiconductor chips, but the first DQ signal is applied only to the first semiconductor chip. Accordingly, the test mode register set pulse signal TMRSP may occur only in the receiver-side semiconductor test device 10 connected to the first semiconductor chip.

A first test mode command corresponding to the first address may be generated in the step S620. Since the test mode register set pulse signal TMRSP is generated only in the receiver-side semiconductor test device 10 of the first semiconductor chip, the first test mode command may be generated only in the receiver-side semiconductor test device 10 of the first semiconductor chip.

The first test mode command is executed in the first semiconductor chip in the step S630.

An execution result of the first test mode command is received and analyzed in the step S640. The execution result may be received and analyzed in the step S640 by the transmitter-side semiconductor test device 20.

The testing of the first semiconductor chip is performed by the above-mentioned steps S610 to S640, and the second semiconductor chip is then tested. The second semiconductor chip may be tested in the same manner as the first semiconductor chip, except that the second semiconductor chip may receive a different DQ signal from the first semiconductor chip.

In more detail, the transmitter-side semiconductor test device 20 may apply a third DQ signal to a third DQ pin of the second semiconductor chip to test the second semiconductor chip, and may apply a second address through the address pin in the step S650. Here, the second address may be different from the first address. The second address is applied in common to the first semiconductor chip and the second semiconductor chip, but the third DQ signal is applied only to the second semiconductor chip. Therefore, the test mode register set pulse signal TMRSP may be generated only in the receiver-side semiconductor test device 10 connected to the second semiconductor chip.

Subsequently, a second test mode command corresponding to the second address may be generated in the step S660. Since the test mode register set pulse signal TMRSP is generated only in the receiver-side semiconductor test device 10 of the second semiconductor chip, the second test mode command may be generated only in the receiver-side semiconductor test device 10 of the second semiconductor chip.

Subsequently, the second test mode command may be executed in the second semiconductor chip in the step S670.

The execution result of the second test mode command may be received and analyzed in the step S680. The step S680 may be performed by the transmitter-side semiconductor test device 20.

Figure 7:
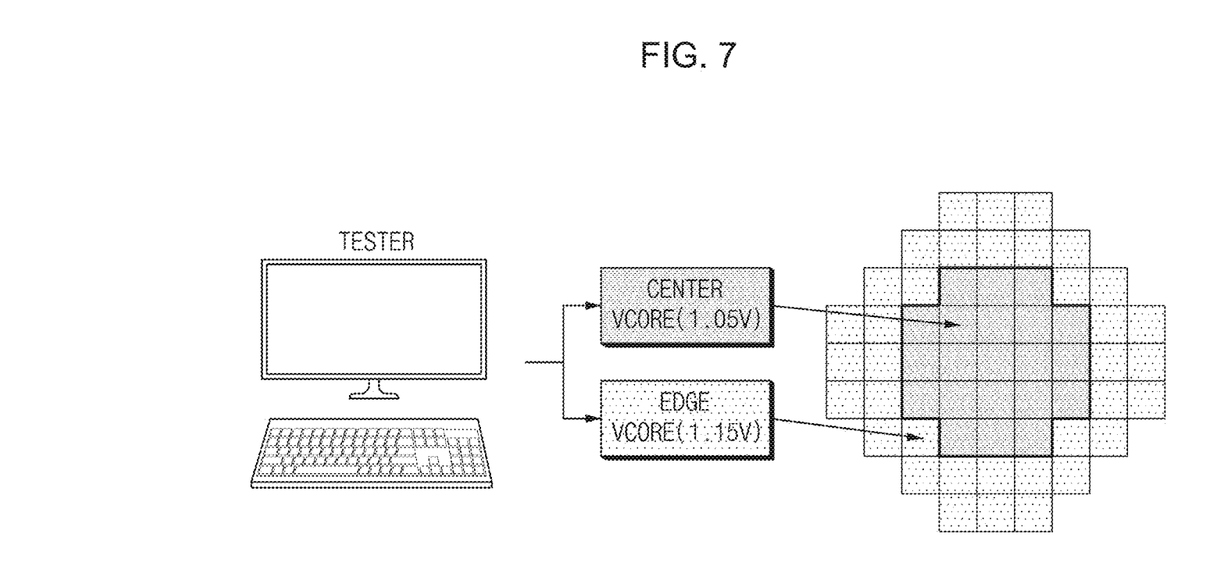
FIG. 7 is a diagram illustrating a semiconductor test device and a wafer according to an embodiment of the present disclosure.

FIG. 7 is a diagram illustrating a semiconductor test device TESTER and a wafer according to an embodiment of the present disclosure.

Referring to FIG. 7, the semiconductor test device TESTER may divide the plurality of semiconductor chips contained in the wafer into center-region semiconductor chips and edge-region semiconductor chips. The semiconductor test device TESTER may apply the internal voltage VCORE (e.g., 1.05V) to each center-region semiconductor chip, and may apply the internal voltage VCORE (e.g., 1.15V) to each edge-region semiconductor chip.

A high-level DQ signal may be applied to the center-region semiconductor chip, and the low-level DQ signal may be applied to the edge-region semiconductor chip. The address A<7> is set to a logic high level, and the mode of the semiconductor chips are set to the test mode. The address A<0:6> may be set to a specific value such that the internal voltage VCORE is set to a specific value (e.g., 1.05V), and test mode commands (e.g., TCM1, TANL1, and TMSET1) are generated. Therefore, the internal voltage VCORE (e.g., 1.05V) may be applied to the center-region semiconductor chip. In other words, the center-region semiconductor chip may be the first semiconductor chip of FIG. 6.

A high-level DQ signal may be applied to the edge-region semiconductor chip, and a low-level DQ signal may be applied to the center-region semiconductor chip. The address A<7> is set to a logic high level, and the mode of the semiconductor chip is set to the test mode. The address A<0:6> may be set to a specific value such that the internal voltage VCORE is set to a specific value (e.g., 1.15V), and test mode commands (TCM2, TANL2, and TMSET2) are generated. Therefore, the internal voltage VCORE (e.g., 1.15V) may be applied to the edge-region semiconductor chip. In other words, the edge-region semiconductor chip may be the second semiconductor chip of FIG. 6.

Here, regions of the wafer (i.e., a part of the wafer where test-target semiconductor chips are located) are classified into two regions and different test mode commands are applied to respective regions. However, the regions of the semiconductor chip may also be classified into three regions (e.g., the center region, the edge region, and the intermediate region interposed between the center region and the edge region). In this case, as can be seen from FIG. 3, the test period may be divided into three periods to test three regions differently, and different DQ signals and test mode commands (or address signal) may be applied depending on the period.

In an embodiment, the semiconductor test device may apply different signals to different groups of semiconductor chips of a wafer without increasing the number of terminals of the semiconductor test device.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor test device comprising:
   a DQ signal application circuit configured to sequentially activate a first DQ signal through a first DQ pin of a first semiconductor chip and a second DQ signal through a second DQ pin of a second semiconductor chip, wherein the second DQ pin is different from the first DQ pin, and the second semiconductor chip is different from the first semiconductor chip;
   an address application circuit configured to apply a first address corresponding to a first test command through an address pin when the first DQ signal is activated and apply a second address corresponding to a second test command through the address pin when the second DQ signal is activated, wherein the address pin is coupled in common to the first semiconductor chip and the second semiconductor chip; and
   a test result input circuit configured to receive a first test result obtained as a result of executing the first test command in the first semiconductor chip and a second test result obtained as a result of executing the second test command in the second semiconductor chip.

2. The semiconductor test device according to claim 1, wherein the DQ signal application circuit activates a first DQ test mode enable signal when activating the first DQ signal.

3. The semiconductor test device according to claim 1, wherein the DQ signal application circuit activates a second DQ enable signal when activating the second DQ signal.

4. The semiconductor test device according to claim 1, wherein the test result input circuit receives the first test result through a DQ pin different from the first DQ pin of the first semiconductor chip.

5. A semiconductor test method for testing a plurality of semiconductor chips including a first semiconductor chip and a second semiconductor chip comprising:
   activating a first DQ signal through a first DQ pin of the first semiconductor chip;
   applying a first address corresponding to a first test command through an address pin coupled in common to the first semiconductor chip and the second semiconductor chip when the first DQ signal is activated;
   activating a second DQ signal through a second DQ pin of the second semiconductor chip when the first DQ signal is deactivated, the second DQ pin being different from the first DQ pin; and
   applying a second address corresponding to a second test command through the address pin when the second DQ signal is activated.

6. The semiconductor test method according to claim 5, wherein a first DQ test mode enable signal is activated when the first DQ test signal is activated.

7. The semiconductor test method according to claim 5, further comprising, receiving a first test result obtained as a result of executing the first test command in the first semiconductor chip.

8. The semiconductor test method according to claim 5, further comprising receiving a second test result obtained as a result of executing the second test command in the second semiconductor chip.

9. The semiconductor test method according to claim 8, wherein the second test result obtained as a result of executing the second test command is received through a DQ pin different from the second DQ pin in the second semiconductor chip.

* * * * *